United States Patent
Yamamoto

(10) Patent No.: US 11,767,851 B2
(45) Date of Patent: Sep. 26, 2023

(54) MAGNETIC BEARING CONTROL APPARATUS AND VACUUM PUMP

(71) Applicant: Edwards Japan Limited, Yachiyo (JP)

(72) Inventor: Masayuki Yamamoto, Yachiyo (JP)

(73) Assignee: Edwards Japan Limited, Yachiyo (JP)

( * ) Notice: Subject to any disclaimer, the term of this patent is extended or adjusted under 35 U.S.C. 154(b) by 104 days.

(21) Appl. No.: 16/764,594

(22) PCT Filed: Nov. 5, 2018

(86) PCT No.: PCT/JP2018/041069
§ 371 (c)(1),
(2) Date: May 15, 2020

(87) PCT Pub. No.: WO2019/102835
PCT Pub. Date: May 31, 2019

(65) Prior Publication Data
US 2020/0386234 A1    Dec. 10, 2020

(30) Foreign Application Priority Data

Nov. 22, 2017 (JP) ................................ 2017-225092

(51) Int. Cl.
*F04D 19/04* (2006.01)
*F16C 32/04* (2006.01)
(Continued)

(52) U.S. Cl.
CPC ........ *F04D 19/048* (2013.01); *F16C 32/0451* (2013.01); *H01F 7/064* (2013.01); *H03F 3/217* (2013.01)

(58) Field of Classification Search
None
See application file for complete search history.

(56) References Cited

U.S. PATENT DOCUMENTS 5,467,244 A    11/1995 Jayawant et al.
5,649,425 A    7/1997 Matsumura et al.
(Continued)

FOREIGN PATENT DOCUMENTS

CN    1111714 A    11/1995
CN    1544878 A    11/2004
(Continued)

OTHER PUBLICATIONS

Machine Translation of JP-2002303503-A (Obtained from USPTO Search, Clarivate Analytics) (Year: 2023).*
(Continued)

*Primary Examiner* — Essama Omgba
*Assistant Examiner* — Geoffrey S Lee
(74) *Attorney, Agent, or Firm* — Shumaker & Sieffert, P.A.

(57) ABSTRACT

A magnetic bearing control apparatus and a vacuum pump which do not require a displacement sensor, which enable control with high accuracy, and which are small and low cost. A rate of change (di/dt) that is a time derivative of a current value $I_m$ flowing through an electromagnet varies in accordance with a magnitude of a displacement of a gap between a target member and the electromagnet. The rate of change (di/dt) can be obtained by detecting a voltage value $V_s$ that is generated at both ends of an inductive element. Therefore, by detecting the voltage value $V_s$, the magnitude of the displacement of the gap can be estimated by calculation. Inductive elements are connected in series to electromagnets and the voltage $V_s$ between the inductive elements is detected by the differential input amplifier. A single period of switching of a PWM switching amplifier is constituted by a current control period of the electromagnet and a displacement detection period for detecting the rate of change (di/dt). In addition, the displacement detection
(Continued)

period is further constituted by a current increase period and a current decrease period which are certain periods of time. The current increase period and the current decrease period are equal to each other.

8 Claims, 7 Drawing Sheets

(51) Int. Cl.
    *H01F 7/06* (2006.01)
    *H03F 3/217* (2006.01)

(56) References Cited

U.S. PATENT DOCUMENTS

| | | | |
|---|---|---|---|
| 5,696,412 A | | 12/1997 | Iannello |
| 5,844,339 A | * | 12/1998 | Schroeder ............ F16C 32/0451 310/68 B |
| 6,407,629 B1 | * | 6/2002 | Burri ........................ H03D 5/00 455/337 |
| 9,479,035 B2 | | 10/2016 | Zhang et al. |
| 2006/0017340 A1 | * | 1/2006 | Kozaki ............... F16C 32/0444 310/90.5 |
| 2006/0171091 A1 | * | 8/2006 | Seale ................. F02D 13/0253 361/160 |
| 2014/0111054 A1 | * | 4/2014 | Heins ....................... H02K 3/00 74/DIG. 9 |
| 2014/0252899 A1 | * | 9/2014 | Looser ................... G01D 5/202 310/90.5 |

FOREIGN PATENT DOCUMENTS

| | | | | |
|---|---|---|---|---|
| CN | 1710800 A | | 12/2005 | |
| CN | 101173851 A | | 5/2008 | |
| CN | 101260906 A | | 9/2008 | |
| CN | 102042321 A | | 5/2011 | |
| EP | 2543956 A2 | | 1/2013 | |
| EP | 2543956 A2 | * | 1/2013 | ............ F16C 32/044 |
| JP | 63303217 A | | 12/1988 | |
| JP | 05280544 A | | 10/1993 | |
| JP | 1182511 A | | 3/1999 | |
| JP | H1182511 A | * | 3/1999 | .......... F16C 32/0448 |
| JP | 2002303503 A | * | 10/2002 | .......... F16C 32/0448 |
| JP | 2002303503 A | | 10/2002 | |
| JP | 2004132537 A | | 4/2004 | |
| JP | 2010159670 A | | 7/2010 | |
| JP | 2014532868 A | | 12/2014 | |
| WO | 1998031946 A | | 7/1998 | |
| WO | 0186159 A1 | | 11/2001 | |

OTHER PUBLICATIONS

Machine Translation of JPH1182511A (Obtained from https://translationportal.epo.org/, 2023) (Year: 2023).*

International Search Report, translation and original, dated Jan. 29, 2019 from counterpart International Application Mo. PCT/JP2018/041069, 7 pp.

Communication from corresponding EP Application No. 18881733.2, dated Dec. 17, 2021, 10 pgs.

* cited by examiner

MAGNETIC BEARING CONTROL APPARATUS AND VACUUM PUMP

This application is a U.S. national phase application under 37 U.S.C. § 371 of international application number PCT/JP2018/041069 filed on Nov. 5, 2018, which claims the benefit of priority to JP application number 2017-225092 filed Nov. 22, 2017. The entire contents of each of international application number PCT/JP2018/041069 and JP application number 2017-225092 are incorporated herein by reference.

TECHNICAL FIELD

The present disclosure relates to a magnetic bearing control apparatus and a vacuum pump and, in particular, to a magnetic bearing control apparatus and a vacuum pump which do not require a displacement sensor, which enable control with high accuracy, and which are small and low cost.

BACKGROUND

With recent developments in electronics, there is a rapidly growing demand for semiconductors such as memories and integrated circuits.

These semiconductors are manufactured by doping an extremely pure semiconductor substrate with an impurity to impart an electric property to the semiconductor substrate, forming a minute circuit on the semiconductor substrate by etching, or the like.

Such operations must be performed inside a chamber in a high-vacuum state in order to circumvent the effect of airborne dust and the like. While vacuum pumps are generally used to exhaust the chamber, in particular, a turbo-molecular pump which is one of such vacuum pumps is frequently used from the perspectives of a small amount of residual gas, easy maintenance, and the like.

In addition, a semiconductor manufacturing process includes a large number of steps in which various process gases are caused to act on a substrate of a semiconductor, and a turbo-molecular pump is used not only to vacuumize the inside of a chamber but also to exhaust such process gases from the chamber.

Furthermore, a turbo-molecular pump is also used in equipment such as electron microscopes in order to put an environment inside a chamber of an electron microscope or the like into a highly vacuum state for the purpose of preventing refraction or the like of an electron beam due to the presence of dust or the like.

The turbo-molecular pump includes a magnetic bearing apparatus for controlling magnetic floating of a rotating body. In addition, while the magnetic bearing apparatus includes a displacement sensor for detecting a positional displacement of the rotating body, conventionally, techniques for estimating a positional displacement of a rotating body without providing the displacement sensor have been disclosed (refer to Japanese Patent Application Laid-open No. H11-82511 and Japanese Patent Application Laid-open No. H7-71456).

Both Japanese Patent Application Laid-open No. H11-82511 and Japanese Patent Application Laid-open No. H7-71456 are magnetic bearings that control an electromagnet current using a pulse width modulation (PWM) system switching amplifier.

In Japanese Patent Application Laid-open No. H11-82511, a rate of change of current (di/dt) is obtained by differentiating a detected value of an electromagnet current with a differentiating circuit. In addition, magnetic bearing control is performed based on a displacement estimated using the fact that the rate of change of current (di/dt) varies in accordance with a gap length between an electromagnet of the magnetic bearing and a rotor shaft.

On the other hand, in Japanese Patent Application Laid-open No. H7-71456, an amount of change of current of a switching-on period or a switching-off period is detected for a certain period of time and a rate of change of current (di/dt) is calculated from the amount of change and the detection time. In addition, magnetic bearing control is performed based on a displacement estimated using the fact that the rate of change of current (di/dt) varies in accordance with a gap length between an electromagnet of the magnetic bearing and a rotor shaft.

SUMMARY

When a switching amplifier is used, a current detected value contains many high-frequency noise components. Therefore, when differentiating a detected value of an electromagnet current with a differentiating circuit as in Japanese Patent Application Laid-open No. H11-82511, there is a risk that noise components may be further amplified, making it difficult to obtain a rate of change of current (di/dt).

In addition, an amount of change in a ripple current is minute relative to an electromagnet current value for magnetic bearing control. Therefore, in the case of Japanese Patent Application Laid-open No. H7-71456, there is a risk that it may become difficult to separate and detect only a ripple current component from an electromagnet current which varies with a large amplitude.

The present disclosure has been made in consideration of such conventional problems, and an object thereof is to provide a magnetic bearing control apparatus and a vacuum pump which do not require a displacement sensor, which enable control with high accuracy, and which are small and low cost.

To this end, the present disclosure describes a magnetic bearing control apparatus, including: an electromagnet which supports a control object in a state floating in the air; an inductive element connected in series to a coil of the electromagnet; a switching amplifier which supplies the electromagnet with a current; voltage extracting means which extracts a voltage applied to the inductive element at timings occurring repeatedly with a prescribed period; sample-holding means which holds a voltage extracted at the timing which is one of the timings; current change rate calculating means which calculates, based on a voltage held by the sample-holding means, a signal proportional to a time derivative of a current flowing through the coil of the electromagnet; and displacement estimating means which estimates, based on a signal calculated by the current change rate calculating means, a displacement between the control object and the electromagnet, wherein a current supplied to the electromagnet is controlled based on a displacement estimated by the displacement estimating means.

Since the coil of the electromagnet and the inductive element are connected in series, a same current flows through the coil of the electromagnet and the inductive element. By extracting a voltage applied to the inductive element at a prescribed timing, a signal proportional to a rate of change that is a time derivative of the current is detected from the voltage. In addition, a displacement between the control object and the electromagnet is estimated using the signal. Furthermore, the current to be supplied to the electromagnet is controlled based on the displacement.

Accordingly, a time derivative of a current ripple that is generated by switching the switching amplifier on or off can be directly detected regardless of a magnitude of a control current of the electromagnet. Therefore, a signal with a large S/N ratio necessary for estimating a displacement at high accuracy and over a wide range can be detected.

As a result, a magnetic bearing can be controlled at an accuracy that is equal to or higher than a case where a displacement sensor is separately provided, thereby realizing downsizing and cost reduction of the magnetic bearing.

In addition, the present disclosure describes a magnetic bearing control apparatus, wherein an inductor is applied to the inductive element, and the voltage extracting means extracts a voltage that is generated in the inductor.

Arranging an inductor enables a magnetic bearing control apparatus without a position sensor to be realized with a small and simple configuration.

Since a time derivative of a current ripple can be stably acquired as a voltage that is generated at both ends of a small inductor of which an inductance is, for example, 1/100 or less of that of an electromagnet as compared to a significant variation in an electromagnet current that is generated when controlling a magnetic bearing, a signal with a large S/N ratio can be detected with a small space.

Furthermore, the present disclosure describes a magnetic bearing control apparatus, wherein a transformer is applied to the inductive element, and the voltage extracting means extracts a voltage of a secondary side of the transformer.

Applying a transformer to the inductive element enables a voltage variation due to a primary-side resistance value of the transformer and a current to be ignored. In addition, the secondary side of the transformer is not affected by a common-mode voltage variation generated by the switching amplifier. Therefore, as an amplifier to be used by the voltage extracting means, a low-speed differential amplifier that accommodates a large common-mode voltage variation need not be used and a high-speed differential amplifier can be used. Furthermore, a settling time of a differential amplifier output can be reduced and responsiveness of control can be improved.

In addition, the present disclosure describes a magnetic bearing control apparatus, wherein the electromagnet is configured to sandwich the control object with electromagnets that oppose each other, a transformer including primary windings connected in series to each electromagnet and secondary windings having a same iron core as the primary windings is applied to the inductive element, each of the primary windings is wound so that each primary winding is oriented in a direction in which a magnetic flux generated therein is canceled out; and the voltage extracting means extracts a voltage generated in the secondary windings of the transformer.

A voltage is induced in a winding of the secondary side of the transformer by a difference in magnetic flux that is generated by a current flowing through a winding of the primary side of the transformer that is connected in series to each electromagnet. In other words, a voltage proportional to a difference in a rate of change of current of a current that flows through each electromagnet is induced in the winding of the secondary side of the transformer. Therefore, a voltage value extracted at a prescribed timing of the sample-holding means is a value proportional to displacement.

Furthermore, the present disclosure describes a magnetic bearing control apparatus, wherein a displacement detection period for extracting a voltage applied to the inductive element is set to a control cycle of the switching amplifier, and the voltage extracting means extracts the voltage applied to the inductive element at least once at prescribed timing during the displacement detection period.

The displacement detection period is arranged separate from a current control period of the electromagnet current. Setting the displacement detection period with respect to the control cycle enables the voltage applied to the inductive element to be detected with favorable accuracy. The sample-holding means can always extract and hold a voltage without variations of a stable stage at a same timing. Therefore, a highly accurate displacement can be obtained.

In addition, the present disclosure describes a magnetic bearing control apparatus, wherein a current increase period in which a current increases and a current decrease period in which the current decreases are formed in the displacement detection period.

Accordingly, a voltage applied to the inductive element can be reliably extracted.

Furthermore, the present disclosure describes a magnetic bearing control apparatus, wherein the voltage extracting means extracts voltages applied to the inductive element at prescribed timings in each of the current increase period and the current decrease period, the magnetic bearing control apparatus further including subtracting means that subtracts one of the extracted voltages from the other, and the displacement estimating means estimates a displacement between the control object and the electromagnet based on the voltage obtained by the subtraction by the subtracting means.

Since the inductor of the inductive element has a slight resistive component, when a low-frequency component of a current value is large, a voltage drop occurs and the voltage drop becomes an offset to be superimposed on a voltage value generated at both ends of the inductive element. This offset component can be removed by subtracting a sampled value of a voltage that is applied to the inductive element during the current decrease period in a second half of the displacement detection period from a sampled value of a voltage that is applied to the inductive element during the current increase period in a first half of the displacement detection period. Therefore, a highly accurate displacement signal can be obtained.

In addition, the present disclosure describes a magnetic bearing control apparatus, further including adding means that adds up the two extracted voltages, and a current flowing through the electromagnet is estimated based on the voltage obtained by the addition by the adding means.

A signal proportional to a current value can be obtained by adding a sampled value of a voltage that is applied to the inductive element during the current decrease period in the second half of the displacement detection period to a sampled value of a voltage that is applied to the inductive element during the current increase period in the first half of the displacement detection period. Therefore, circuits and resistors dedicated to current detection can be omitted.

Furthermore, the present disclosure describes a magnetic bearing control apparatus, wherein the current increase period and the current decrease period of the displacement detection period are formed at a duty ratio of 50%.

Since period of times of the current increase period and the current decrease period in the displacement detection period are equal to each other, a current variation in the displacement detection period becomes 0 and does not affect an average value of an electromagnet current.

In addition, the present disclosure describes a magnetic bearing control apparatus, wherein the current increase period is set before the current decrease period in the displacement detection period.

A switching amplifier is only capable of supplying a current in one direction. When the average value of the electromagnet current in the displacement detection period is near 0, the current increase period is provided before the current decrease period in the displacement detection period in order to avoid a situation where the current value becomes 0 in the current decrease period.

Furthermore, the present disclosure describes a vacuum pump, the vacuum pump being mounted with a magnetic bearing control apparatus including: an electromagnet which supports a control object in a state floating in the air; an inductive element connected in series to a coil of the electromagnet; a switching amplifier which supplies the electromagnet with a current; voltage extracting means which extracts a voltage applied to the inductive element at timings occurring repeatedly with a prescribed period; sample-holding means which holds a voltage extracted at the timing which is one of the timings; current change rate calculating means which calculates, based on a voltage held by the sample-holding means, a signal proportional to a time derivative of a current flowing through the coil of the electromagnet; and displacement estimating means which estimates, based on a signal calculated by the current change rate calculating means, a displacement between the control object and the electromagnet, a current supplied to the electromagnet being controlled based on a displacement estimated by the displacement estimating means, wherein the control object is a rotor shaft, and the vacuum pump includes the electromagnet in plurality for floatingly supporting the rotor shaft in a radial direction and/or an axial direction.

In addition, the present disclosure describes a vacuum pump, including the inductive element respectively connected in series to the coil of each of the electromagnets, wherein the sample-holding means acquires a voltage applied to the inductive element based on a signal having been synchronized over control cycles of the switching amplifiers of all electromagnets.

A plurality of electromagnets are used when the rotor shaft is floated in a contactless manner. When each electromagnet performs displacement detection at an arbitrary timing, noise generated by switching of the switching amplifier affects a sampled value of other electromagnets. In order to avoid such a situation, displacement detection by all of the electromagnets and all sampling and holding operations are performed in synchronization.

Alternatively, a timing at which an effect of the noise decreases may be assessed in advance through actual measurement, and the sampling and holding operations may be performed at the assessed timing.

Furthermore, the present disclosure describes a vacuum pump, further including current extracting means that extracts a current supplied to the coil of the electromagnet by the switching amplifier, and current sample-holding means that holds a current flowing through the current extracting means at a prescribed timing, wherein the prescribed timing by the current sample-holding means is a signal which had been synchronized in the control cycle.

Highly accurate control can be performed by also synchronizing an extraction timing of a current that flows through the coils of the electromagnets.

As described above, since the present technology may be configured to include: voltage extracting means which extracts a voltage applied to an inductive element at a prescribed timing; current change rate calculating means which calculates, based on a voltage held by sample-holding means, a signal proportional to a time derivative of a current flowing through a coil of an electromagnet; and displacement estimating means which estimates, based on a signal calculated by the current change rate calculating means, a displacement between a control object and the electromagnet, a time derivative of a current ripple that is generated by switching a switching amplifier on or off can be directly detected regardless of a magnitude of a control current of the electromagnet.

Therefore, a signal with a large S/N ratio necessary for estimating a displacement at high accuracy and over a wide range can be detected.

As a result, a magnetic bearing can be controlled at an accuracy that is equal to or higher than a case where a displacement sensor is separately provided, thereby realizing downsizing and cost reduction of a magnetic bearing.

DETAILED DESCRIPTION

Figure 1:
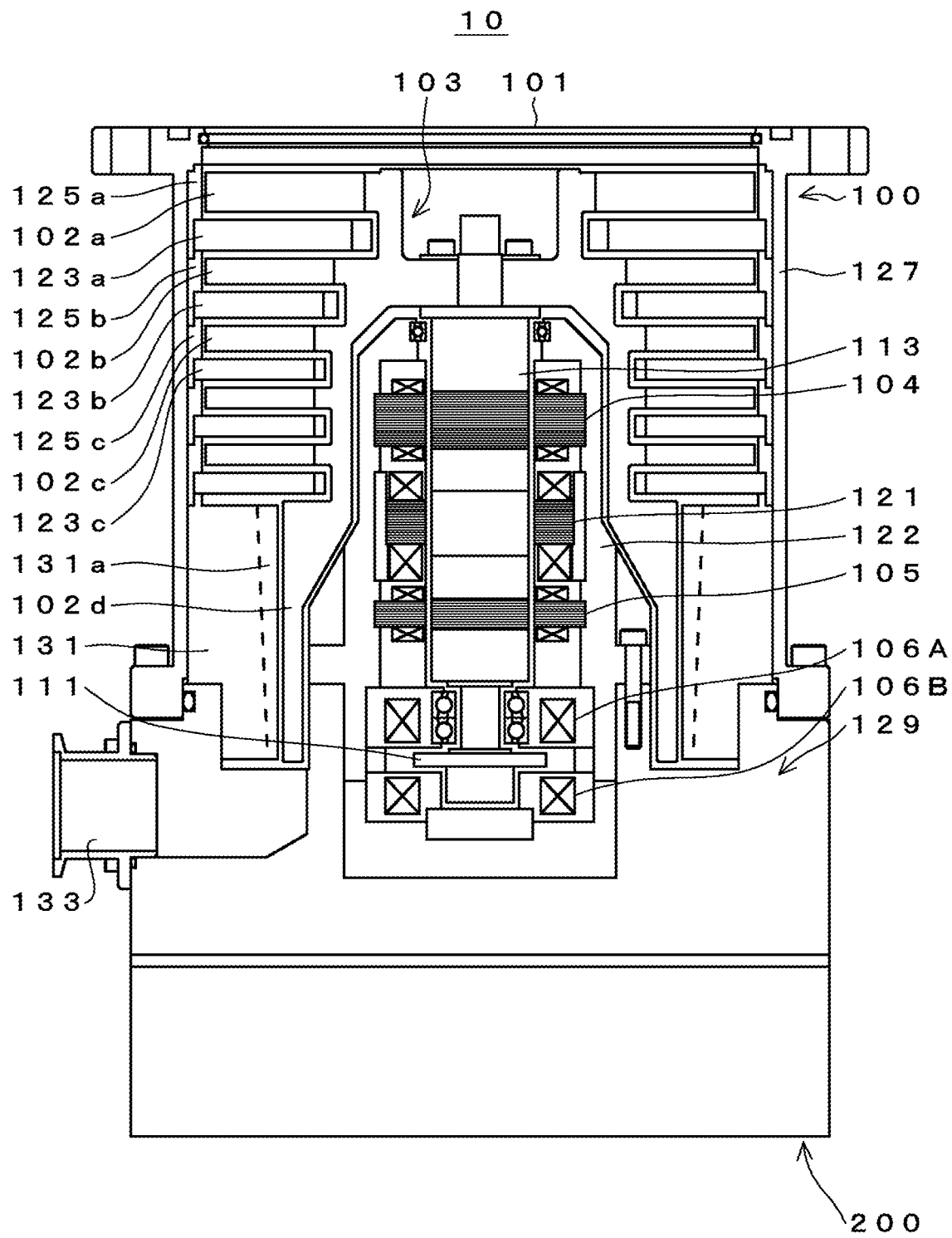
FIG. 1 is a configuration diagram of a turbo-molecular pump.

Hereinafter, an embodiment of the present disclosure will be described. FIG. 1 is a configuration diagram of a turbo-molecular pump.

In FIG. 1, an inlet port 101 is formed at an upper end of a cylindrical outer cylinder 127 of a pump main body 100. A rotating body 103 in which a plurality of rotor blades 102a, 102b, 102c, . . . constituted by turbine blades for sucking and exhausting gas are radially formed in multiple stages in a peripheral portion inside the outer cylinder 127.

A rotor shaft 113 is mounted to a center of the rotating body 103 and, for example, a so-called five-axis control magnetic bearing supports the rotor shaft 113 in a state floating in the air and controls a position of the rotor shaft 113.

As an upper radial electromagnet 104, four electromagnets are arranged so as to form pairs along mutually orthogonal X and Y axes which are coordinate axes in a radial direction of the rotor shaft 113.

The rotor shaft 113 is formed of a high magnetic permeability material (such as iron) or the like and is configured so as to be sucked by a magnetic force of the upper radial electromagnet 104. The adjustment described above is respectively independently performed in an X axis direction and a Y axis direction.

In addition, a lower radial electromagnet 105 is arranged in a similar manner to the upper radial electromagnet 104 and adjusts a position in the radial direction of a lower side of the rotor shaft 113 in a similar manner to the position in the radial direction of the upper side.

Furthermore, axial electromagnets 106A and 106B are arranged so as to vertically sandwich a disc-shaped metal disk 111 provided in a lower part of the rotor shaft 113. The metal disk 111 is constituted by a high magnetic permeability material such as iron.

The axial electromagnet 106A and the axial electromagnet 106B respectively suck the metal disk 111 upward and downward by magnetic force.

As described above, a control apparatus 200 is configured to appropriately adjust magnetic forces exerted on the metal disk 111 by the axial electromagnets 106A and 106B to magnetically float the rotor shaft 113 in the axial direction and hold the rotor shaft 113 in space in a contactless manner.

A motor 121 includes a plurality of magnetic poles circumferentially arranged so as to surround the rotor shaft 113. Each magnetic pole is controlled by the control apparatus 200 so as to rotationally drive the rotor shaft 113 via an electromagnetic force which acts between the magnetic pole and the rotor shaft 113.

A plurality of stator blades 123a, 123b, 123c, . . . are arranged across small gaps from the rotor blades 102a, 102b, 102c, . . . . The rotor blades 102a, 102b, 102c, . . . are formed inclined by a prescribed angle relative to a plane perpendicular to an axial line of the rotor shaft 113 in order to respectively transport a molecule of exhaust gas downward when the exhaust gas collides.

[In addition, the stator blade 123 is also formed inclined by a prescribed angle relative to a plane perpendicular to the axial line of the rotor shaft 113 and is arranged so as to alternate with the stages of the rotor blade 102 toward inside of the outer cylinder 127.

Furthermore, an end of the stator blade 123 is supported in a state of being fitted and inserted between a plurality of stacked stator blade spacers 125a, 125b, 125c, . . . .

The stator blade spacer 125 is a ring-shaped member constituted by, for example, a metal such as aluminum, iron, stainless steel, or copper or a metal such as an alloy containing these metals as components.

The outer cylinder 127 is fixed across a small gap in an outer periphery of the stator blade spacer 125. A base portion 129 is arranged in a bottom portion of the outer cylinder 127, and a threaded spacer 131 is arranged between a lower portion of the stator blade spacer 125 and the base portion 129. In addition, an outlet port 133 which communicates with the outside is formed in a lower portion of the threaded spacer 131 in the base portion 129.

The threaded spacer 131 is a cylindrical member constituted by a metal such as aluminum, copper, stainless steel, or iron or a metal such as an alloy containing these metals as components, and a spiral thread groove 131a is engraved in plurality on an inner circumferential surface of the threaded spacer 131.

A direction of the spirals of the thread grooves 131a is a direction in which, when a molecule of exhaust gas moves in a direction of rotation of the rotating body 103, the molecule is transported toward the outlet port 133.

A cylindrical portion 102d is suspended from a lowermost portion which continues from the rotor blades 102a, 102b, 102c, . . . of the rotating body 103. An outer peripheral surface of the cylindrical portion 102d is cylindrical in shape and overhangs toward the inner circumferential surface of the threaded spacer 131, and is in proximity to the inner circumferential surface of the threaded spacer 131 across a prescribed gap.

The base portion 129 is a disc-shaped member constituting a base of a turbo-molecular pump 10 and is generally constituted by a metal such as iron, aluminum, or stainless steel.

Since the base portion 129 physically holds the turbo-molecular pump 10 and also has a function of a heat conductive path, a metal having both rigidity and high thermal conductivity such as iron, aluminum, or copper is desirably used.

In the configuration described above, when the rotor blade 102 is driven by the motor 121 and rotates together with the rotor shaft 113, exhaust gas from the chamber is sucked through the inlet port 101 due to actions of the rotor blade 102 and the stator blade 123.

The exhaust gas sucked from the inlet port 101 passes between the rotor blade 102 and the stator blade 123 and is transported to the base portion 129.

The exhaust gas transported to the threaded spacer 131 is sent to the outlet port 133 while being guided by the thread grooves 131a.

Figure 2:
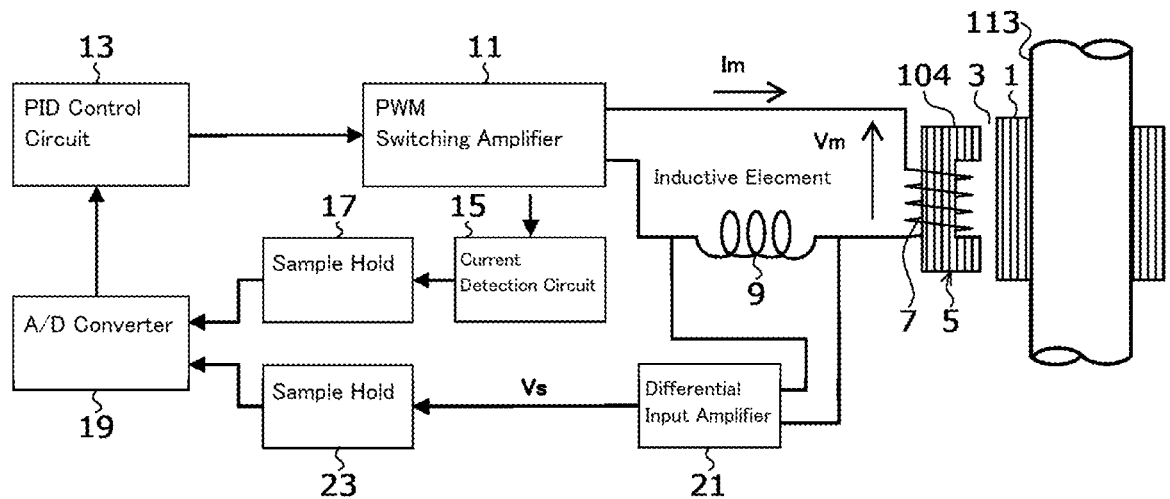
FIG. 2 is a block diagram of a method of estimating a gap length between an electromagnet and a rotor shaft.

Next, a method of estimating a gap length between an electromagnet and a rotor shaft will be described. First, a configuration thereof will be described based on the block diagram shown in FIG. 2. A target member 1 which has a cylindrical shape, through which a magnetic flux readily passes, and which corresponds to a control object is fixed to a periphery of the rotor shaft 113. However, the target member 1 can also be omitted. In this case, the rotor shaft 113 corresponds to the control object. In addition, electromagnets 5 of the upper radial electromagnet 104 are arranged across a prescribed gap 3 from the target member 1. The upper radial electromagnet 104 is constituted by a total of four electromagnets 5 so that pairs are respectively formed in the X axis direction and the Y axis direction.

A coil 7 is wound around the electromagnet 5. An inductive element 9 is connected in series to the coil 7. The electromagnet 5 and the inductive element 9 are to be supplied a current from a PWM switching amplifier 11. In addition, a PID-adjusted signal is to be input to the PWM switching amplifier 11 from a PID control circuit 13. A current Im is detected from the PWM switching amplifier 11 by a current detection circuit 15, and a sample hold 17 is configured to acquire a current value Im at that timing based on a prescribed sample signal. The current value Im acquired at this point is converted into a digital value by an A/D converter 19 and the digital value is to be input to the PID control circuit 13.

In addition, a differential input amplifier 21 is connected to both terminals of the inductive element 9, a voltage Vs between both terminals of the inductive element 9 is detected, and a sample hold 23 is configured to acquire a voltage value Vs at that timing based on a prescribed sample signal. The voltage value Vs acquired at this point is converted into a digital value by the A/D converter 19 and the digital value is to be input to the PID control circuit 13. The A/D converter 19 and the PID control circuit 13 are constituted by digital signal processors (DSP).

Figure 3:
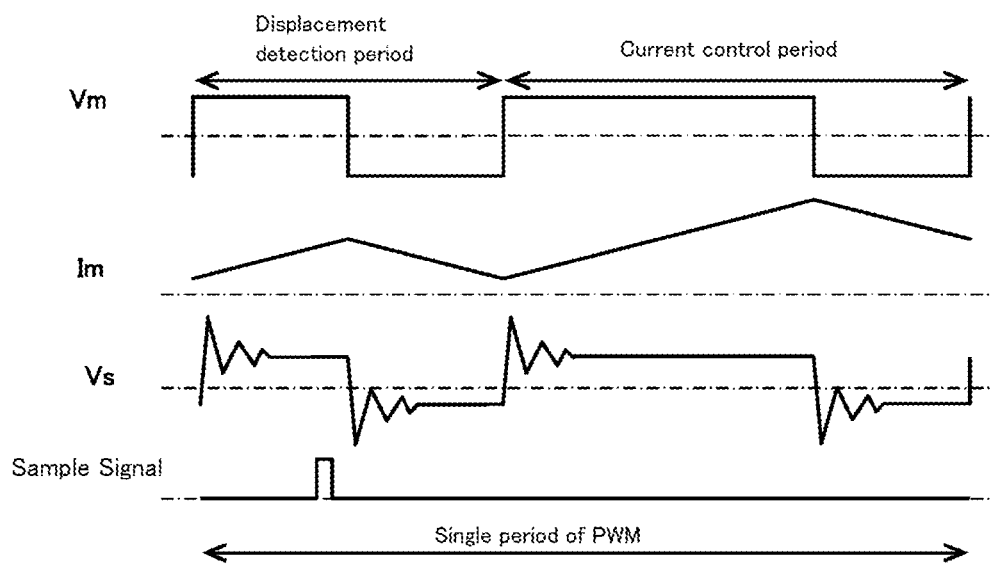
FIG. 3 is a diagram showing a relationship among an electromagnet voltage, an electromagnet current, a voltage of an inductive element, and a sample signal in a single period of PWM.

Next, an action of the embodiment of the present disclosure will be described with reference to FIG. 3. FIG. 3 shows a relationship among a voltage Vm and an electromagnet current Im of the electromagnet 5, a voltage Vs of the inductive element 9, and a sample signal in a single period of PWM.

A rate of change (di/dt) that is a time derivative of the current value Im flowing through the electromagnet 5 varies in accordance with a magnitude of a displacement of the gap 3 between the target member 1 and the electromagnet 5. In this case, the rate of change (di/dt) can be obtained by detecting the voltage value Vs that is generated at both ends of the inductive element 9. Therefore, by detecting the voltage value Vs, the magnitude of a displacement of the gap 3 can be estimated by calculation.

In other words, in FIG. 3, the current value Im flows through the electromagnet 5 and, at the same time, a same current flows through the inductive element 9. Therefore, by detecting the voltage value Vs that is generated at both ends of the inductive element 9 when a current varies when the PWM switching amplifier 11 is switched on/off, a signal proportional to the rate of change (di/dt) that is a time derivative of the current value Im is detected from the voltage value Vs. In addition, a displacement of the gap 3 between the target member 1 and the electromagnet 5 is estimated using the signal, and a magnetic bearing is controlled based on the displacement.

While an inductance obtained from the rate of change (di/dt) also includes an inductance (Ls) of the inductive element 9 which is unrelated to displacement, by setting an inductance (Lm) of the electromagnet 5 to a minute value, an effect of the inductance can be made negligible. When a power supply voltage of the PWM switching amplifier 11 is denoted by E, an inductive element voltage during a current variation is approximately E×Ls/(Lm+Ls), indicating that a voltage from which a signal can be sufficiently processed can be detected even when Ls/Lm<$1/100$. For example, when the inductance (Lm) of the electromagnet 5 is 20 mH, the inductance (Ls) of the inductive element 9 is set to around 0.1 mH.

The inductive elements 9 are connected in series to the electromagnets 5 and the voltage Vs between the inductive elements 9 is detected by the differential input amplifier 21. As shown in FIG. 3, a single period of switching of the PWM switching amplifier 11 is constituted by a current control period of the electromagnet 5 and a displacement detection period for detecting the rate of change (di/dt). In addition, the displacement detection period is further constituted by a current increase period and a current decrease period which are certain periods of time. Desirably, the current increase period and the current decrease period are equal periods of time (a duty ratio of 50%).

In a case of equal periods of time as described above, since an increased value of a current during the current increase period and a decreased value of the current during the current decrease period are equal to each other, an effect of providing the displacement detection period on PWM current control can be reduced. In addition, the displacement detection period is desirably set in a period in which the voltage value Vs is stable after a settling period elapses.

The sample hold 23 acquires the voltage value Vs in the current increase period, in the current decrease period, or in both periods. After the voltage value Vs acquired by the sample hold 23 is converted into a digital signal by the A/D converter 19, the digital signal is converted into an estimated value of displacement by a signal processing circuit such as a DSP to be used for magnetic bearing control. The PID control circuit 13 obtains a deviation between the value of the displacement which is estimated at this point and a command value at a position (not shown), and determines a current command value in accordance with a magnitude of the deviation. In addition, a PWM signal is adjusted so that the current value Im extracted by the current detection circuit 15 assumes the current command value.

Accordingly, the rate of change (di/dt) of a current ripple that is generated by switching the PWM on or off can be directly detected regardless of a magnitude of a control current of the electromagnet 5. Therefore, a signal with a large S/N ratio necessary for estimating a displacement at high accuracy and over a wide range can be detected.

As a result, a magnetic bearing can be controlled at an accuracy that is equal to or higher than a case where a displacement sensor is separately provided, thereby realizing downsizing and cost reduction of a magnetic bearing.

Hereinafter, respective practical examples will be described.

First Practical Example

Figure 4:
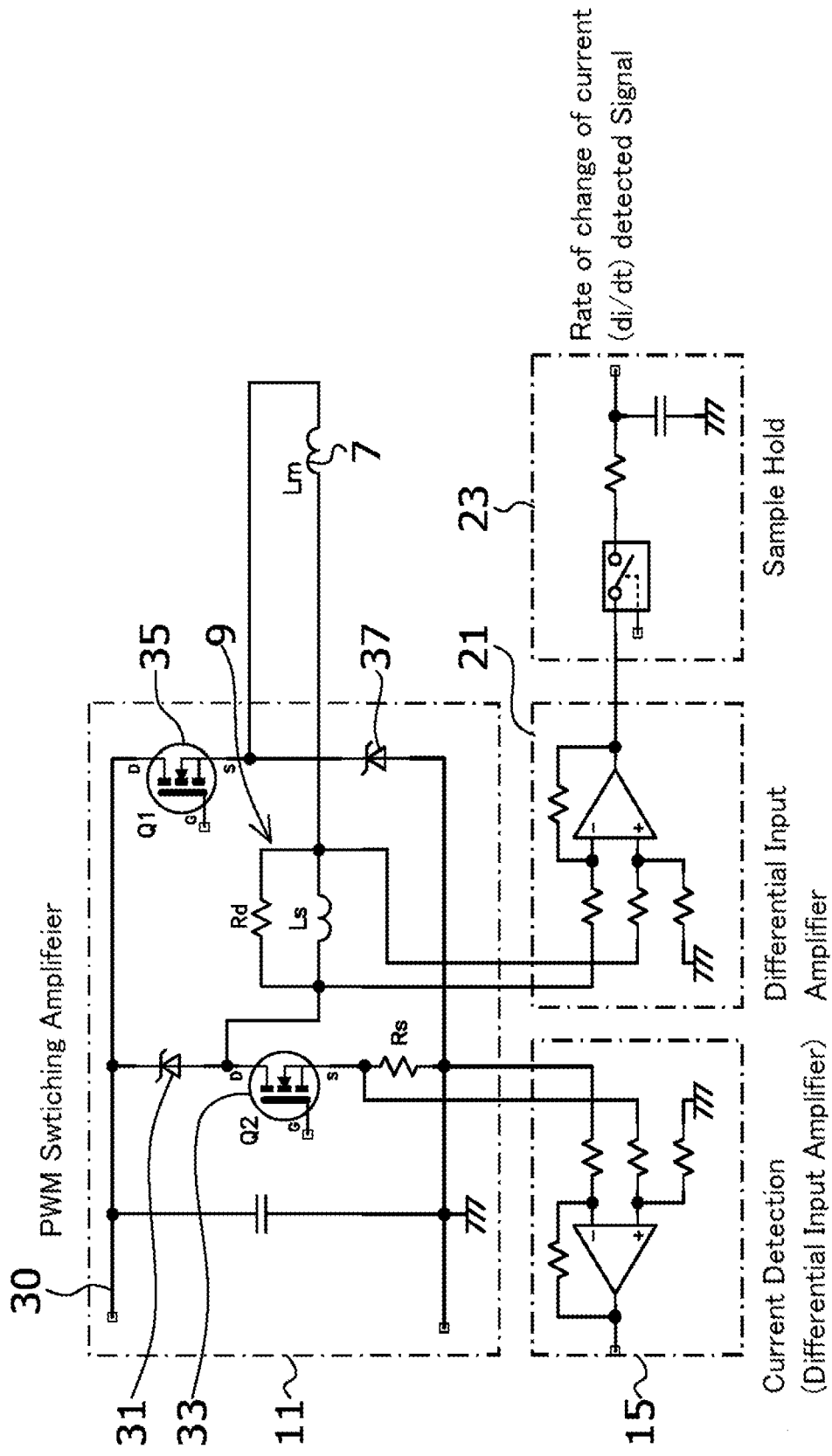
FIG. 4 is a circuit diagram of a First Practical Example.

FIG. 4 is a circuit diagram of First Practical Example. Elements that are the same as those in FIG. 2 will be denoted by same reference signs and descriptions thereof will be omitted.

FIG. 4 shows specific circuit configuration examples of the PWM switching amplifier 11, the differential input amplifier 21, and the sample hold 23. In FIG. 4, a power supply 30 is a DC power supply of +20 to 60 V. A cathode of a diode 31 is connected to the power supply 30, and a drain terminal of an FET 33 is connected to an anode of the diode 31. A resistor Rs is connected between a source terminal of the FET 33 and ground. In addition, a drain terminal of an FET 35 is connected to the power supply 30. A cathode of a diode 37 is connected to the source terminal of the FET 35, and an anode of the diode 37 is connected to ground. The coil 7 of the electromagnet 5 and the inductive element 9 are connected in series between the source terminal of the FET 35 and the drain terminal of the FET 33.

In this case, an inductor (Ls) is used as the inductive element 9, and the current value Im is to be detected using the resistor Rs. A resistor Rd is a damping resistor for attenuating resonance between a parasitic capacitance of the inductance (Lm) of the electromagnet 5 and the inductance of the inductive element 9.

In the configuration described above, a PWM signal including settings of a displacement detection period and a current control period are input to respective gate terminals of the FET 33 and the FET 35.

At this point, as shown in FIG. 3, both the voltage Vm of the electromagnet 5 and the voltage value Vs that is generated at both ends of the inductive element 9 during a single period significantly vary to a positive potential and a negative potential.

When a gap length of the gap 3 between the target member 1 and the electromagnet 5 is denoted by g=g0+Δg, a rate of change (di/dt) that is a time derivative of the current value Im flowing through the electromagnet 5 is proportional to the gap length g. By measuring the rate of change (di/dt) at a gap length g0 in a steady state in advance by an experiment or the like, a displacement Δg from the gap length g0 in a steady state can be estimated.

Since the rate of change (di/dt) that is a time derivative of the current value Im can be stably acquired as the voltage Vs that is generated at both ends of the inductive element 9 as compared to control of a magnetic bearing causing a current that flows through the inductive element 9 to vary significantly, a signal with a large S/N ratio can be detected.

Second Practical Example

Figure 5:
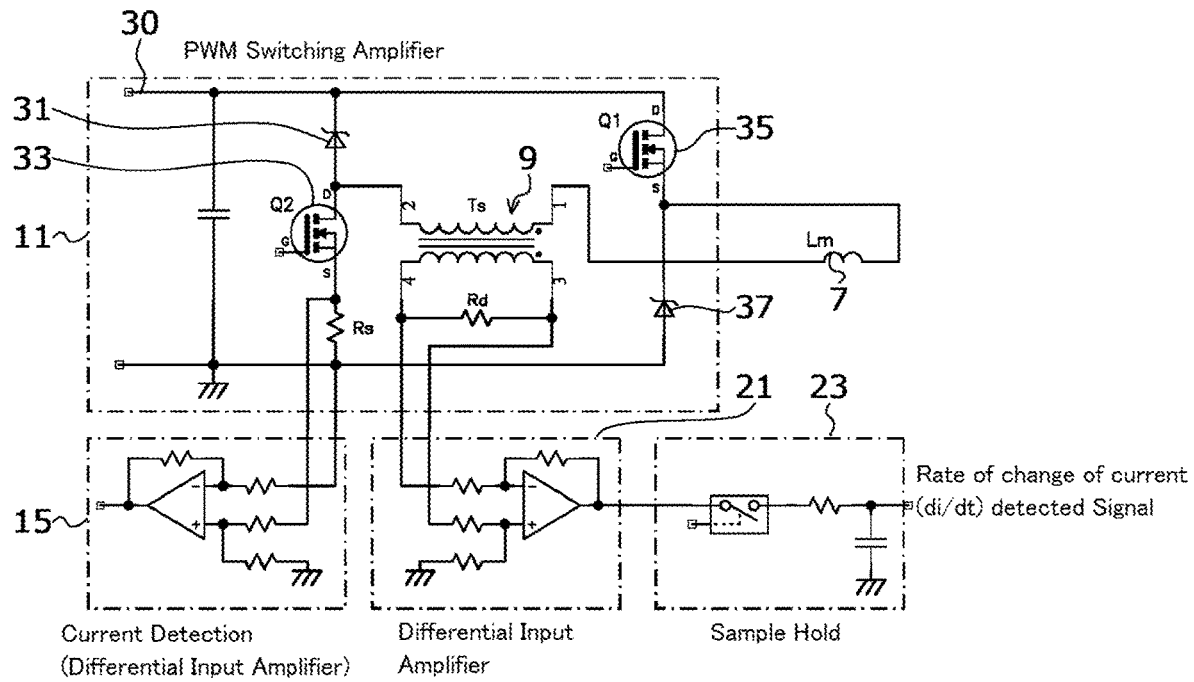
FIG. 5 is a circuit diagram of a Second Practical Example.

FIG. 5 shows a circuit diagram of Second Practical Example. Elements that are the same as those in FIG. 4 will be denoted by same reference signs and descriptions thereof will be omitted.

In FIG. 5, a transformer Ts is used as the inductive element 9. The resistor Rd is a damping resistor for attenuating resonance between a parasitic capacitance of the inductance (Lm) of the electromagnet 5 and the inductance (Ls) of the transformer Ts.

Using the transformer Ts in the configuration described above has the following advantages.

Specifically, a voltage variation due to a primary-side resistance value of the transformer Ts and the current value Im can be ignored. In addition, the secondary side of the transformer is not affected by a common-mode voltage variation generated by the PWM switching amplifier 11. Therefore, as the differential input amplifier 21, a low-speed differential amplifier that accommodates a large common-mode voltage variation need not be used and a high-speed differential amplifier can be used. Furthermore, since a settling time of a differential amplifier output can be reduced, the displacement detection period can be reduced. Accordingly, a long current control period during a single period can be secured and responsiveness of control can be improved.

Third Practical Example

Figure 6:
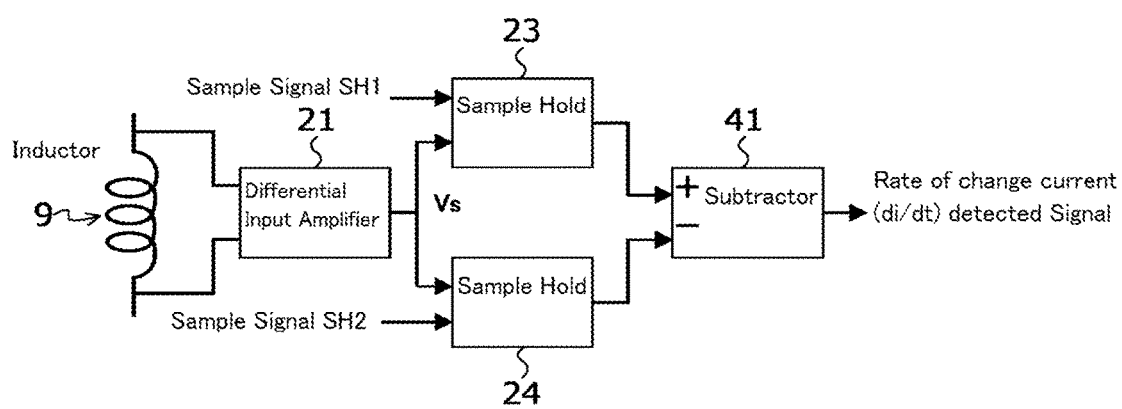
FIG. 6 is a circuit diagram of a Third Practical Example.
Figure 7:
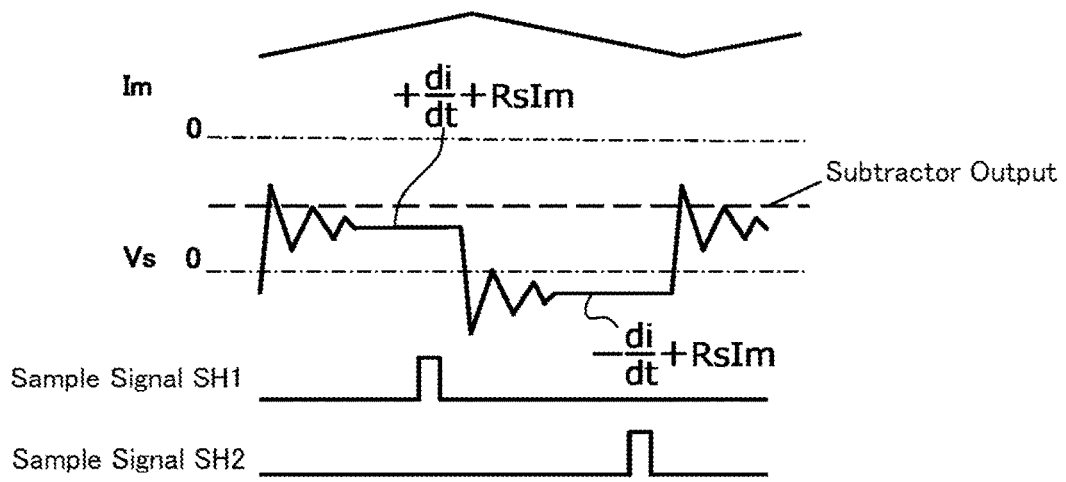
FIG. 7 is a diagram showing a relationship among a sample signal, an electromagnet current, and a voltage of an inductive element during a single period according to the Third Practical Example.

FIG. 6 shows a circuit diagram of Third Practical Example. In addition, FIG. 7 shows a relationship among a sample signal, the current value Im, and the voltage value Vs that is generated at both ends of the inductive element 9 during a single period. Elements that are the same as those in FIG. 4 will be denoted by same reference signs and descriptions thereof will be omitted.

Since the inductor of the inductive element 9 has a slight resistive component Rs, when a low-frequency component of the current value Im is large, a voltage drop RsIm occurs and the voltage drop RsIm becomes an offset to be superimposed on the voltage value Vs that is generated at both ends of the inductive element 9. Specifically, the voltage value Vs detected using a sample signal SH1 of the sample hold 23 in a first half of the displacement detection period is +di/dt+RsIm, and the voltage value Vs detected using a sample signal SH2 of a sample hold 24 in a second half of the displacement detection period is −di/dt+RsIm.

Therefore, this offset component can be removed by subtracting a sampled value of the current decrease period in the second half of the displacement detection period from a sampled value of the current increase period in the first half of the displacement detection period with a subtractor 41. Therefore, a highly accurate displacement signal can be obtained.

In this case, a timing of sampling is set within a stable voltage region in which voltage variation is suppressed in consideration of a settling time of the differential input amplifier 21.

Fourth Practical Example

Figure 8:
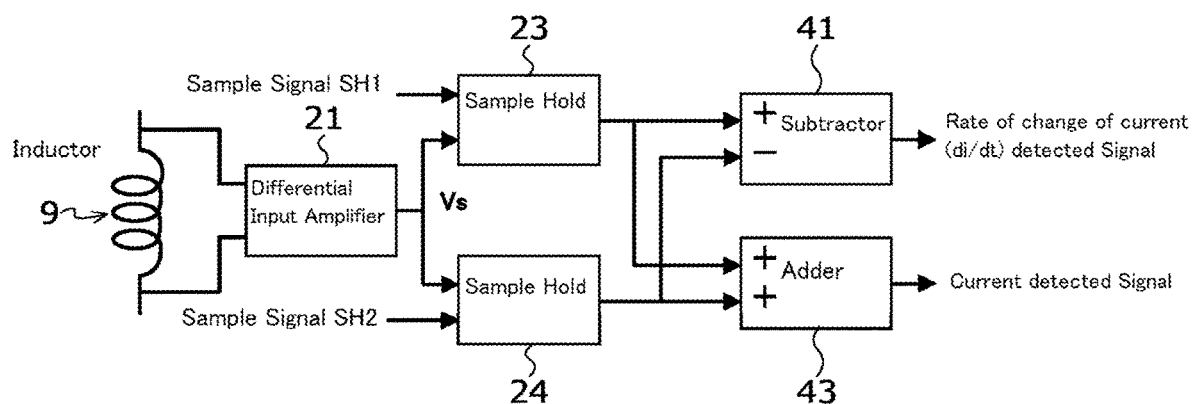
FIG. 8 is a circuit diagram of a Fourth Practical Example.
Figure 9:
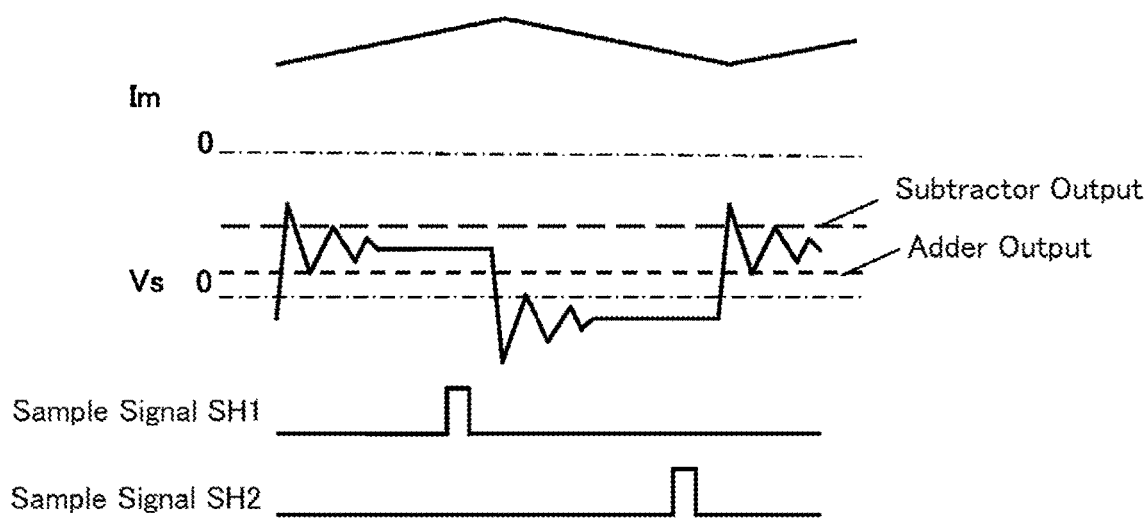
FIG. 9 is a diagram showing a relationship among a sample signal, an electromagnet current, and a voltage of an inductive element during a single period according to the Fourth Practical Example.

FIG. 8 shows a circuit diagram of Fourth Practical Example. In addition, FIG. 9 shows a relationship among a sample signal, the current value Im, and the voltage value Vs that is generated at both ends of the inductive element 9 during a single period. Elements that are the same as those in FIG. 4 will be denoted by same reference signs and descriptions thereof will be omitted.

In a similar manner to Third Practical Example, since the inductor of the inductive element 9 has a slight resistive component Rs, when a low-frequency component of the current value Im is large, a voltage drop RsIm occurs and the voltage drop RsIm becomes an offset to be superimposed on the voltage value Vs that is generated at both ends of the inductive element 9. Specifically, the voltage value Vs detected using a sample signal SH1 of the sample hold 23 in a first half of the displacement detection period is +di/dt+RsIm, and the voltage value Vs detected using a sample signal SH2 of the sample hold 24 in a second half of the displacement detection period is −di/dt+RsIm.

Therefore, this offset component can be removed by subtracting a sampled value of the current decrease period in the second half of the displacement detection period from a sampled value of the current increase period in the first half of the displacement detection period with the subtractor 41. On the other hand, a signal proportional to the current value Im is obtained by adding up a sampled value of the current decrease period and a sampled value of the current increase period with an adder 43. Therefore, a displacement signal with high accuracy can be obtained and, at the same time, circuits dedicated to current detection (the current detection circuit 15 in FIGS. 2 and 4 and the resistor Rs in FIG. 4) can be omitted by adding the adder 43.

Fifth Practical Example

Figure 10:
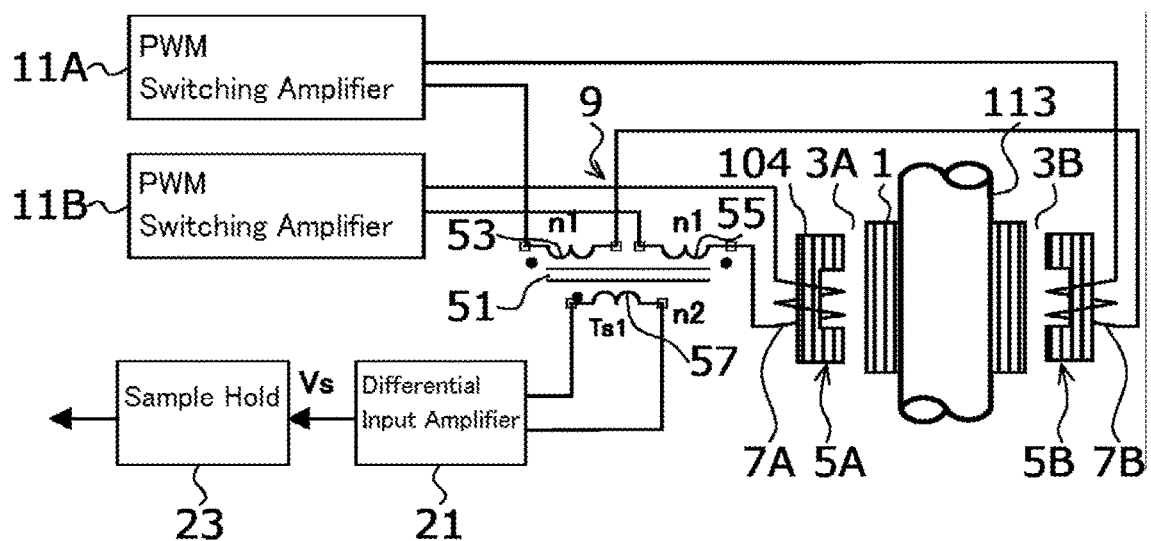
FIG. 10 is a circuit diagram of a Fifth Practical Example.

FIG. 10 shows a circuit diagram of Fifth Practical Example. Elements that are the same as those in FIG. 2 will be denoted by same reference signs and descriptions thereof will be omitted. The upper radial electromagnet 104 is constituted by a total of four electromagnets 5 so that pairs are respectively formed in the X axis direction and the Y axis direction. For example, an electromagnet 5A and an electromagnet 5B are arranged so as to oppose each other in the X axis direction as shown in FIG. 10. In this case, one gap 3A between the target member 1 and the electromagnet 5A is represented by g0+Δg, and another gap 3B between the target member 1 and the electromagnet 5B is represented by g0−Δg.

The inductive element 9 is constituted by a transformer in which three windings 53, 55, and 57 are wound around a same iron core 51. The primary-side winding 53 is connected in series to a coil 7B of the electromagnet 5B and the primary-side winding 53 is to be supplied a current from a PWM switching amplifier 11A. In addition, the primary-side winding 55 is connected in series to a coil 7A of the electromagnet 5A and the primary-side winding 55 is to be supplied a current from a PWM switching amplifier 11B.

By arranging the primary-side windings 53 and 55 of the transformer so as to have polarities as shown in the drawing, magnetic fluxes respectively generated by the primary-side windings 53 and 55 cancel out each other.

In addition, a voltage for current increase and current decrease is applied to the electromagnet 5A and the electromagnet 5B at a same timing.

Therefore, a voltage is induced in the secondary-side winding 57 of the transformer by a difference in magnetic fluxes that are generated by a current flowing through the primary-side windings 53 and 55 of the transformer. In other words, a voltage proportional to a difference in a rate of change of current of a current that flows through the electromagnet 5A and the electromagnet 5B is induced in the secondary-side winding 57 of the transformer. Therefore, the voltage value Vs detected using a sample signal SH1 of the sample hold 23 is a value proportional to a displacement Δg. Accordingly, there is no longer a need to estimate Δg from g0+Δg which is obtained when a measurement is performed with only an electromagnet on one side.

Figure 11:
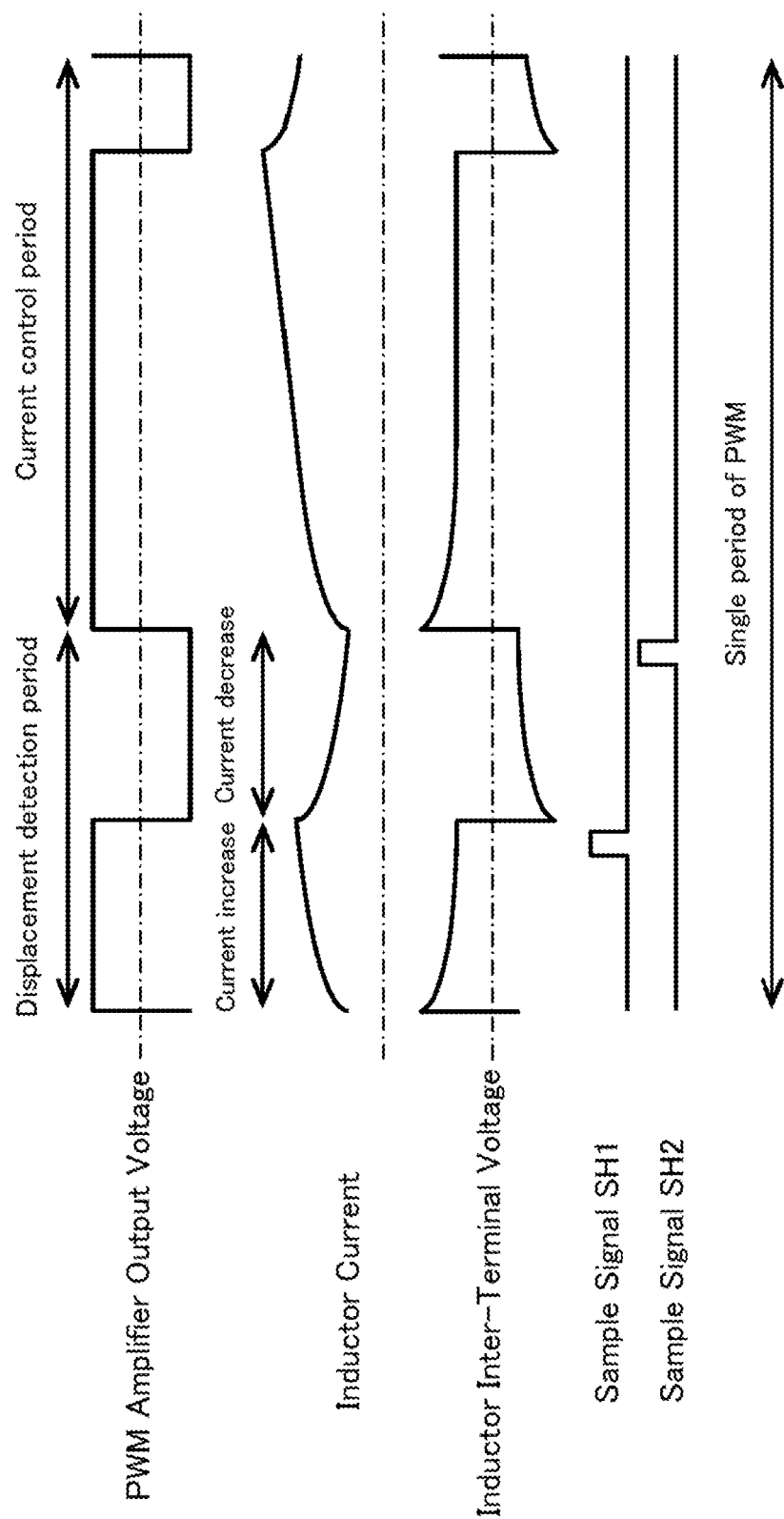
FIG. 11 is a diagram showing behavior of a current when affected by an eddy current and hysteresis.

It should be noted that, for the sake of brevity, the current value Im flowing through the inductive element 9 is linearly described in the respective practical examples presented above. However, an actual current value Im does not increase or decrease at a constant rate of change (di/dt) due to effects of an eddy current or hysteresis that is generated in a magnetic material of the electromagnet 5 as shown in FIG. 11. di/dt varies in accordance with an elapsed time from a point at which an amplifier output voltage is switched and gradually approaches a certain value. The sample signal SH is desirably generated at a time point where the certain value is reached. In addition, by making a period of time from switching to sampling in the displacement detection period always constant, effects of an eddy current, hysteresis, and the like can be avoided.

Since the displacement detection period is separated from the current control period of the electromagnet current and period of times of the current increase period and the current decrease period in the displacement detection period are equal to each other, a current variation in the displacement detection period becomes 0 and does not affect an average value of an electromagnet current. When the displacement detection period is long, an average value of the electromagnet current that can be increased or decreased in a single period of PWM control decreases and control responsiveness of the electromagnet current declines. Therefore, a length of the displacement detection period must at least be set shorter than a length of the current control period and desirably set to or under ¼ thereof.

In addition, the PWM switching amplifier 11 described above is only capable of supplying a current in one direction. When the average value of the electromagnet current in the displacement detection period is near 0, the current increase period is desirably provided before the current decrease period in the displacement detection period in order to avoid a situation where the current value becomes 0 in the current decrease period.

Furthermore, when the rotating body 103 is floated in a contactless manner, a plurality of electromagnets including the upper radial electromagnet 104, the lower radial electromagnet 105, and axial electromagnets 106A and 106B are used. When each electromagnet performs displacement detection at an arbitrary timing, noise generated by switching of the PWM switching amplifier 11 affects a sampled value of other electromagnets 5. In order to avoid such a situation, displacement detection by all of the electromagnets 5 and all sampling and holding operations are performed in synchronization.

Moreover, it will be obvious to those skilled in the art that various changes and modifications may be made without departing from the spirit of the present disclosure and that the present disclosure also encompasses such changes and modifications.

What is claimed is:

1. A magnetic bearing control apparatus, comprising:
   an electromagnet which supports a control object in a state floating in the air;
   an inductive element connected in series to a coil of the electromagnet;
   an inductor applied to the inductive element;
   a switching amplifier which supplies a current to the electromagnet;
   voltage extracting means which extracts a voltage applied to the inductive element at timings occurring repeatedly with a prescribed period, wherein the voltage is generated in the inductor;
   sample-holding means which holds the extracted voltage at a timing which is one of the timings until a next timing for extracting;
   current change rate obtaining means which obtains, based on a voltage held by the sample-holding means, a signal proportional to a time derivative of a current flowing through the coil of the electromagnet; and
   displacement estimating means which estimates, based on a signal obtained by the current change rate obtaining means, a displacement between the control object and the electromagnet,
   wherein a current supplied to the electromagnet is controlled based on a displacement estimated by the displacement estimating means,
   wherein the voltage extracting means extracts the voltages applied to the inductive element at prescribed timings in each of a current increase period in which the current increases and a current decrease period in which the current decreases,
   wherein an adding means adds up two extracted voltages, and
   wherein a current flowing through the electromagnet is estimated based on a value obtained by addition by the adding means.

2. The magnetic bearing control apparatus according to claim 1, wherein a transformer is also applied to the inductive element, and the voltage extracting means is further configured to extract the voltage of a secondary side of the transformer.

3. The magnetic bearing control apparatus according to claim 1, wherein
   the electromagnet is configured to sandwich the control object with electromagnets that oppose each other,
   a transformer including primary windings connected in series to each electromagnet and secondary windings having a same iron core as the primary windings is also applied to the inductive element,
   each of the primary windings is wound so that each primary winding is oriented in a direction in which a magnetic flux generated therein is canceled out, and
   the voltage extracting means extracts a second voltage generated in the secondary windings of the transformer.

4. The magnetic bearing control apparatus according to claim 1, wherein
   the extracted voltage is a first voltage of voltages applied to the inductive element at prescribed timings,
   the magnetic bearing control apparatus further including subtracting means that subtracts one of the extracted voltages from another, and
   the displacement estimating means estimates a displacement between the control object and the electromagnet based on a subtracted voltage obtained by the subtracting means.

5. The magnetic bearing control apparatus according to claim 1, wherein the current increase period and the current decrease period of the displacement detection period are formed at a ratio of 50%.

6. The magnetic bearing control apparatus according to claim 1, wherein the current increase period is set before the current decrease period in the displacement detection period.

7. A vacuum pump being mounted with a magnetic bearing control apparatus including:
    an electromagnet which supports a control object in a state floating in the air;
    an inductive element connected in series to a coil of the electromagnet;
    a switching amplifier which supplies a current to the electromagnet;
    voltage extracting means which extracts a voltage applied to the inductive element at timings occurring repeatedly with a prescribed period;
    sample-holding means which holds a voltage extracted at a timing which is one of the timings until a next timing for extracting, and sample-holding means acquires the voltage applied to the inductive element based on a signal having been synchronized over control cycles of the switching amplifier;
    current change rate obtaining means which obtains, based on a voltage held by the sample-holding means, a signal proportional to a time derivative of a current flowing through the coil of the electromagnet; and
    displacement estimating means which estimates, based on a signal obtained by the current change rate obtaining means, a displacement between the control object and the electromagnet,
    a current supplied to the electromagnet being controlled based on a displacement estimated by the displacement estimating means,
    wherein the voltage extracting means extracts the voltages applied to the inductive element at prescribed timings in each of a current increase period in which the current increases and a current decrease period in which the current decreases,
    wherein an adding means adds up two extracted voltages, wherein a current flowing through the electromagnet is estimated based on a value obtained by addition by the adding means, and
    wherein the control object is a rotor shaft, and
    the vacuum pump includes the electromagnet in plurality for floatingly supporting the rotor shaft in a radial direction and/or an axial direction.

8. The vacuum pump according to claim 7, further comprising:
    current extracting means that extracts a current supplied to the coil of the electromagnet by the switching amplifier, and
    current sample-holding means that holds a current flowing through the current extracting means at a prescribed timing, wherein the prescribed timing by the current sample-holding means is a signal which had been synchronized in the control cycle.

* * * * *